United States Patent
Oszustowicz

(10) Patent No.: US 6,656,802 B2
(45) Date of Patent: Dec. 2, 2003

(54) PROCESS OF MANUFACTURING A SEMICONDUCTOR DEVICE INCLUDING A BURIED CHANNEL FIELD EFFECT TRANSISTOR

(75) Inventor: Jean-Luc Oszustowicz, Brie-Comte-Robert (FR)

(73) Assignee: Koninklijke Philps Electronics N.V., Eindhoven (NL)

( * ) Notice: Subject to any disclaimer, the term of this patent is extended or adjusted under 35 U.S.C. 154(b) by 0 days.

(21) Appl. No.: 09/773,414

(22) Filed: Feb. 1, 2001

(65) Prior Publication Data

US 2001/0024845 A1 Sep. 27, 2001

(30) Foreign Application Priority Data

Feb. 4, 2000 (EP) ............................................. 00400318

(51) Int. Cl.[7] .............................................. H01L 21/336
(52) U.S. Cl. ........................ 438/282; 438/285; 438/589
(58) Field of Search ................................. 438/282, 300, 438/461, 285, 299, 589, 590, 604, 605, 606, 607, 635, 767, 779, 931

(56) References Cited

U.S. PATENT DOCUMENTS

| 4,186,410 | A | * | 1/1980 | Cho et al. ...................... 357/67 |
| 5,654,214 | A | * | 8/1997 | Frijlink et al. ................. 438/172 |
| 5,770,525 | A | * | 6/1998 | Kamiyama ..................... 438/745 |
| 5,923,980 | A | * | 7/1999 | Gardner et al. ................ 438/270 |
| 5,937,299 | A | * | 8/1999 | Michael et al. ................ 438/299 |
| 5,945,695 | A | * | 8/1999 | Takikawa ....................... 257/192 |
| 6,030,849 | A | * | 2/2000 | Hasegawa et al. .............. 438/46 |
| 6,144,049 | A | * | 11/2000 | Onda .............................. 257/194 |
| 6,184,547 | B1 | * | 2/2001 | Onda .............................. 257/15 |
| 6,194,747 | B1 | * | 2/2001 | Onda .............................. 257/192 |
| 6,197,645 | B1 | * | 3/2001 | Michael et al. ................ 438/300 |
| 6,326,317 | B1 | * | 12/2001 | Wang et al. .................... 438/779 |

FOREIGN PATENT DOCUMENTS

| EP | 0690506 B1 | | 1/1996 | |
| JP | 2-232942 A | * | 9/1990 | ........ 438/FOR 344 |
| JP | 4-264736 A | * | 9/1992 | |
| JP | 8-172182 A | * | 7/1996 | |

* cited by examiner

Primary Examiner—George Fourson
Assistant Examiner—Fernando Toledo
(74) Attorney, Agent, or Firm—Aaron Wagner

(57) ABSTRACT

A process of manufacturing a semiconductor device including a buried channel field effect transistor comprising, for realizing said field effect transistor, steps of forming a stacked arrangement of semiconductor layers on a substrate including an active layer (3), forming a recess in said active layer, referred to as gate recess (A4), for constituting a channel between source and drain electrodes, and forming a submicronic gate electrode (G) which is in contact with the active layer (3) in said gate recess (A4), wherein:

the gate recess width (Wri) and the gate length (LGo) are manufactured with predetermined respective values, in order that the access region, defined between the gate (G) and the gate recess edge (31), has an access region width (2Δo), derived from said predetermined values (Wri, LGo), which is sufficiently small to permit the transistor of functioning according to saturation current characteristics having continuous slopes.

12 Claims, 5 Drawing Sheets

PROCESS OF MANUFACTURING A SEMICONDUCTOR DEVICE INCLUDING A BURIED CHANNEL FIELD EFFECT TRANSISTOR

The invention relates to a process of manufacturing a semiconductor device including a buried channel field effect transistor comprising, for realizing said field effect transistor, steps of forming a stacked arrangement of layers on a substrate including an active layer, forming a recess in said active layer, called gate recess, for constituting a channel between source and drain electrodes, and forming a gate electrode which is in contact with the active layer in said gate recess.

The invention finds its application for example in the manufacture of microwave frequency circuits which are monolithically integrated in a III–V semiconductor material technology (MMICs).

A process for manufacturing a field effect transistor with buried channel is known from the patent EP 0 690 506. This process comprises steps of manufacturing both a N-OFF and a N-ON transistors at the same time, with a recessed gate. For manufacturing said transistors, these steps comprise depositing, on a substrate, an active layer of GaAlAs and a cap layer of GaAs. The active layer has a non-zero aluminum content while the cap-layer does not contain aluminum. Ohmic contacts for the source and drain electrodes are first formed. Then, a first photo-resist layer is deposited on the cap layer, covering the source and drain electrodes. Gate openings for forming gate contacts are carried out in said first photoresist layer. Performing the gate recesses and the gate electrodes comprise: etching the cap layer using a plasma of a fluorine compound, through the photo-resist gate openings, until a stopper layer is formed at the upper surface of the active layer by formation of aluminum fluoride; elimination of the stopper layer; etching the active layer, for forming a first part of the gate recess of the enhancement transistor, during which, the depletion transistor is covered by a protective layer; then said protective layer is eliminated and the two gate recesses are completed down to the bottom level corresponding to the N-OFF and the N-ON transistors to be formed; and depositing in the gate recesses a metal material for forming the gates having lengths equal to the widths of the photo-resist gate openings. During this process, the openings formed in the semiconductor layers are made larger than the photoresist gate openings by using etching techniques that perform underetching.

Several field effect transistor types exist at the moment, among them transistors which are normally conducting (N-ON) when the gate is at the same potential as the source and which are pinched off through depletion when the potential of the gate is more negative than that of the source, and transistors which are normally pinched off (N-OFF) when the gate is at the same potential as the source and which are rendered conducting by enhancement when the potential of the gate becomes more positive than that of the source. In these field effect transistors, the active layer below the gate electrode has a given thickness, which is smaller in the enhancement-type transistor than in the depletion-type transistor. In integrated semiconductor devices realized from III–V materials, such as GaAs compounds, amplifier transistors may be realized by enhancement-type transistors, while the charges are realized in active form by depletion-type transistors.

In vacuum or air, for example, the doped GaAs material of the active layer has a surface tension which is determined by the Fermi-level—the surface states being situated at the center of the forbidden band—and which is of the order of −0.5 V. The result is that the active layer is normally depleted on either side of the gate contact, in the so-called access regions, which are accordingly non-conducting in the normal state. In the depletion-type transistor (N-ON), this surface effect is less unfavorable because the active layer is comparatively thick below the gate, which allows the transistor to be normally conducting up to the moment where an application of a negative gate voltage depletes the active layer also below the gate itself, rendering the transistor completely non-conducting. In the enhancement-type transistor (N-OFF), where the active layer below the gate is thinner, this surface effect is always very unfavorable because the depleted access regions occupy non-negligible portions of the active layer with respect to the thickness on either side of the gate. These depleted access regions are not rendered conducting by the application of a positive gate voltage with respect to the source, which enhances the active layer practically only below the gate, and accordingly the number of electrons generated is lower than expected. The saturation velocity is in addition reduced. Accordingly, the saturation current, which depends on the number of generated electrons and on the saturation velocity, is reduced thereby.

The cited document does not present a solution to the problem posed by these depleted access regions.

This problem particularly occurs when realizing transistors provided with a recessed gate having a very small gate length inferior to 0.2 $\mu$m, as currently needed in the field of semiconductor devices, and having subsequently very narrow access regions, for example of the order of magnitude of the gate length. This problem is especially acute in the case of enhancement-type transistors (N-OFF). For example, this problem occurs when forming a transistor having a gate whose length is as small as possible, typically 0.1 $\mu$m, which is disposed in a recess whose total width is as small as possible, typically 0.25 to 0.30 $\mu$m. In this case, the access region total width is of the order of 0.15 $\mu$m to 0.20 $\mu$m. This problem, called Kink effect, is revealed by the formation of a discontinuity of the slope of the saturation current characteristic. This characteristic is a curve of the drain-source current in function of the drain-source voltage for a given gate-source voltage. So, considering a N-OFF transistor having a pinch-off voltage between −0.1 and +0.4V, when the drain-source voltage is less than 3 V, the saturation current characteristic shows a first slope that is not steep enough. When the drain-source voltage reaches values superior to 3V, said saturation current shows a second different slope that is steeper. Now, it may be needed to dispose of a transistor having such small gate length and working with a drain-source voltage in a range of 0.5V to 4V or 5V. The discontinuity in the saturation current characteristic slope shows that it is not possible to use such recessed gate transistor having such a small gate length and narrow access regions and working properly in said range of drain-source voltage.

An other problem lies in the fact that a transistor having such small dimensions is very difficult to manufacture. So, the manufacturing process must be very simple, involving as few steps as possible and as few layers as possible, which is by itself difficult.

The present invention has for its object to provide a semiconductor device including a field effect transistor with a one-recessed gate having a gate length inferior to 0.21$\mu$ and an improved saturation current characteristic, while using a process of fabrication involving very simple techniques, for providing this semiconductor device in large quantities at low cost, and accurate performances. The present invention has also for its object to provide a semiconductor device including such a field effect transistor, which may be used in low noise and high bit rate applications.

A process of manufacturing a semiconductor device including such a transistor is claimed in claim 1. According to the invention, it has been found that the Kink effect problem of the discontinuity in the saturation current characteristic curve occurs when the gate length is inferior to 0.2 μm in a transistor and when the access region total width is too large with respect to the gate length. The present process permits of solving this problem and is available for obtaining either an enhancement or a depletion-type transistor having a gate length inferior to 0.2 μm with simple process means.

The invention is described below with reference to the annexed diagrammatic figures, wherein.

Figure 1A:
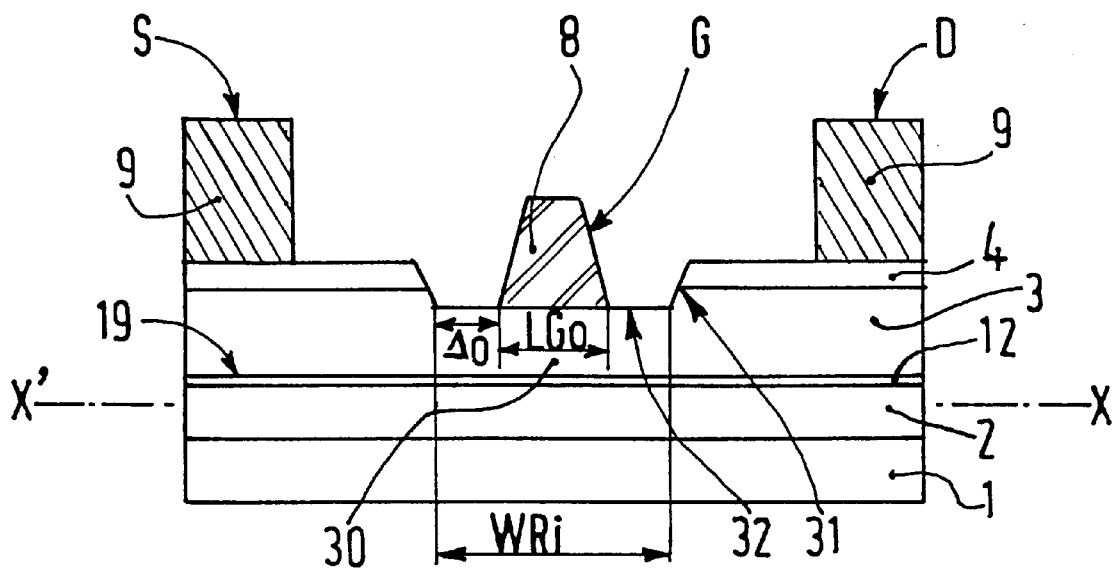
FIG. 1A shows a cross-cut view of a one-recessed gate field effect transistor and FIG. 1B shows a top view of this field effect transistor in a semiconductor device.

The invention relates to the manufacture of semiconductor devices such as a Monolithic Microwave Integrated Circuit (MMIC). Such a semiconductor device includes, as shown in FIG. 1A and in FIG. 1B, a field effect transistor which comprises, stacked on a semiconductor substrate 1, at least a semiconductor active layer 3. In a preferred embodiment, the active layer 3 is covered by a semiconductor cap-layer 4 of lower resistivity. The field effect transistor also comprises, on the semiconductor layers, a source electrode S and a drain electrode D between which a channel is realized by means of a gate recess 31, 32 that has a bottom 32 and an edge 31. This transistor further comprises a gate electrode G which is in contact with the active layer 3 at the bottom 32 of this recess 31, 32. The transverse dimensions are measured along the axis X'–X of the figures. The width between a gate edge and the opposite recess edge is referred to as access region width Δo. The total access region width 2Δo is further considered. The gate length is denoted by LGo. The total recess width is denoted by WRi.

Figure 2A:
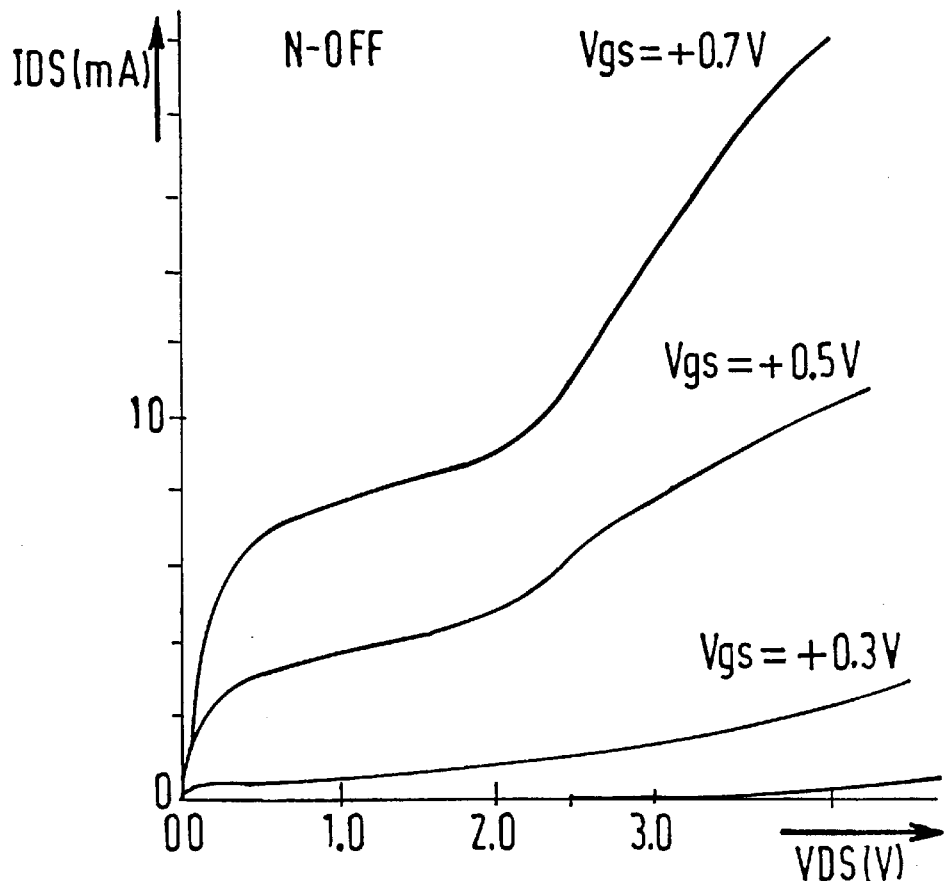
FIG. 2A shows a saturation current characteristic of a defective transistor.
Figure 2B:
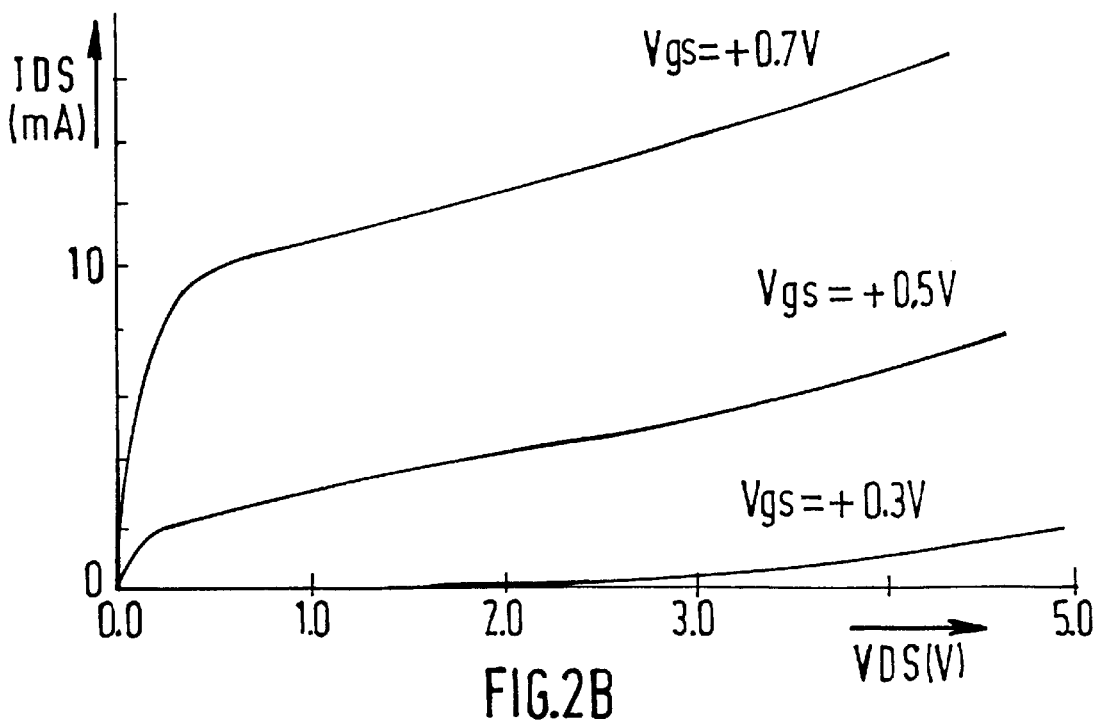
FIG. 2B shows the corresponding curve of a transistor designed according to the invention.

According to the invention, it has been found that a first approach of manufacturing a field effect transistor having a gate length of 0.1 μm deposited in a gate recess having a total width in the range of 0.25 μm to 0.30 μm, results in functioning problems. In the above-cited approach, the gate length of 0.1 μm and the resulting access region width 2Δo of 0.15 μm to 0.20 μm were thought appropriate because their values were as small as possible in the present state of the art. However, referring to FIG. 2A, which shows drain-source current $I_{DS}$ versus drain-source voltage $V_{DS}$ characteristic curves, at constant gate-source voltages $V_{GS}$, malfunctioning (Kink effect) of the field effect transistor occurs, revealed by a discontinuity of the slope of each current saturation characteristic curve. For such a field effect transistor of the N-OFF type, which has a pinch-off voltage between −0.1V to 0.4V, when the drain-source voltage is less than 3V, the saturation current slope of each curve is almost flat, which is a drastic problem. The saturation current becomes steeper only when the drain-source voltage rises above certain values, which values depend on the access region width 2Δo. The larger is said access region width 2Δo with respect to the gate length LGo, the more important is the malfunctioning. Said otherwise, the smaller is the gate length with respect to a given recess width, the more important is the malfunctioning. Instead, in a transistor designed according to the invention, the malfunctioning has been eliminated. Referring to FIG. 2B, this revealed the saturation current characteristic curves of said transistor, which now show continuous uniform slopes (elimination of the Kink effect).

In the field effect transistor, the largest is the access region width 2Δo, the largest is a current saturation at the gate access. This is due to an electron "desertion" near the upper surface of the active layer, in said access region, where the thickness of the active layer is the smallest. This electron "desertion" phenomenon is all the more important as the gate length is the shortest, typically inferior to 0.2 μm. The electron desertion is overcome when the drain-source voltage reaches sufficient values. This phenomenon results in the saturation current characteristic slope discontinuity. The present invention proposes a solution to the difficult problem of manufacturing such transistors, due to the fact that it is wanted to produce a total recess width as small as possible knowing the present state of the art, that it is not wanted to produce a substantially enlarged transistor gate length, and that it is however wanted to produce an appropriately reduced access region width.

In the present process, the total recess width WRi is now in the range of 0.20 μm to 0.25 μm, which is smaller than in the above-cited approach; and moreover, the gate length LGo is preferably 0.13 μm; so, the access region width 2Δo is now in the range of 0.07 μm to 0.12 μm. The present process provides a transistor with a gate length LGo, which is not substantially enlarged with respect to the previously considered possible 0.1 μm gate length, and with a recess total width WRi that is smaller than what was considered as possible, so that the access region width 2Δo is appropriately reduced to obtain that the saturation current characteristic curves $I_{DS}/V_{DS}$ of the transistor show continuous slopes according to the curves of FIG. 2B. The reduction of 0.05 μm of recess width together with the increase of 0.03 μm for the gate length leads to the small reduction of 0.08 μm for the access region width 2Δo, which is most important, necessary and sufficient for solving the access region problem together with the not too large increase of 0.03 μm for the gate length. Such small differences solve the problem of the saturation current characteristics. Thus, the present invention proposes a process of manufacturing the field effect transistor having such appropriate dimensions, in order to overcome the above-described defect. Said process is particularly simple, using only one photo-resist layer in the steps of forming the total gate recess width WRi, the access region width 2Δo and the gate electrode G with gate length LGo of appropriate values.

Figure 1B:
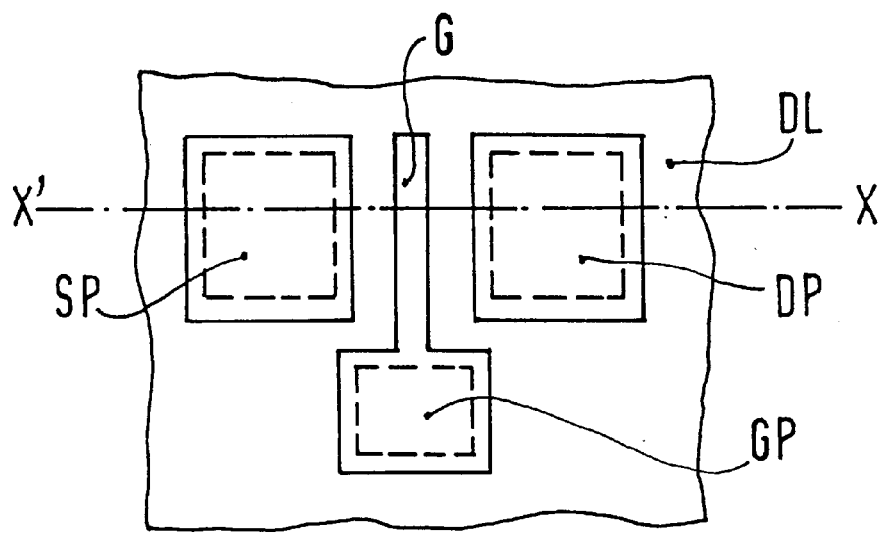

In FIGS. 1A and 1B, the transistor is of the high electron mobility type (HEMT) and comprises, in the stacked arrangement for forming the active layer realized on the substrate 1, at least two layers having different electron affinities so as to form a heterojunction comprising a lower active layer 12 made of a first material having a first forbidden bandwidth and an upper active layer 3 made of a second material having a greater forbidden bandwidth and forming a hetero-structure with the first layer 12, with interface 19 therebetween. In FIGS. 1A and 1B, for forming the structure of the HEMT, advantageously a cap-layer 4 strongly $n^{++}$ doped is present. This cap-layer has a function of reducing the source and drain resistance by increasing the conduction of the semiconductor material in the regions situated below the ohmic source and drain contacts S, D, and a function of forming a spatial separation between the channel region and the regions lying below the ohmic source and drain contacts S, D, which are mechanically and electrically disturbed during the fusion of the material 9 of said ohmic contacts S and D owing to the fact that the material 9 is an eutectic material for forming a metal-semiconductor alloy.

The HEMT structure also comprises a metal pad 8 for the gate G which is directly deposited on the material of the upper active layer 3 so as to form a Schottky barrier that is present at a very exact distance 30 away from the bottom of the active layer 3, i.e. from the interface 19 of the heterostructure. This distance 30 represents the effective thickness of the upper active layer 3 and governs the operation of the transistor, i.e. its pinch-off voltage, whereby an enhancement-type or instead a depletion-type transistor is formed. By way of example, an enhancement field effect transistor (N-OFF) has a distance between the gate contact G and the interface 19 of the hetero-structure of the order of 20 nm. This transistor operates at a gate-source voltage in a range of 0 mV to +700 mV, with a pinch-off voltage in a range of −0.1 V to +0.3 V, typically of +0.1 V. This field effect transistor shows not only improved saturation current characteristic curves as in FIG. 2B, but also is appropriate to be applied to low noise and high bit rate circuits. In the transistor described above, the portion 30 of the active layer 3 lying below the gate recess is preferably not intentionally doped.

Figure 3A:
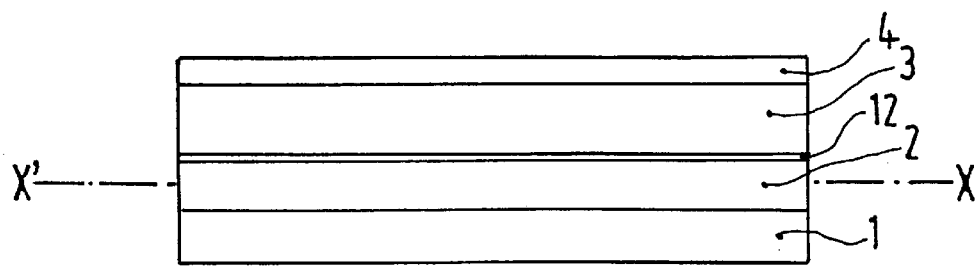
FIGS. 3A to 3H illustrate the steps of manufacturing the field effect transistor.

Referring to FIG. 1B, the upper surface of the semiconductor device including the transistor is labeled DL. Contact pads SP, DP and GP are provided on said upper surface corresponding to the source S, drain D and gate G. An advantageous process for realizing a field effect transistor having a one-level recessed gate, and source and drain electrode contacts, as described above, may include several steps illustrated by FIGS. 3A to 3H.

a) Referring to FIG. 3A, for forming a field effect transistor, the process may comprise the formation of a substrate 1 from semi-insulating gallium-arsenide and the formation of an active layer 3 of gallium arsenide (GaAs), called Schottky layer. In a preferred embodiment, for forming a transistor HEMT, the process may comprise the formation of a substrate 1 from semi-insulating gallium arsenide (GaAs); the formation of a layer 2, called buffer layer, of not intentionally doped gallium arsenide (GaAs) having a thickness lying between 100 and 1000 nm, preferably a thickness of 300 nm; the formation of a layer 12 of gallium-indium arsenide (GaInAs) called channel layer and having an indium concentration of the order of 22%, not intentionally doped below the gate recess, and having a thickness lying between about 0 and 30 nm, preferably 10 nm; the formation of a layer 3 of gallium-aluminum arsenide (GaAlAs), called Schottky layer, with a non-zero concentration of aluminum (Al), 0.1% being sufficient, and about 22% being preferable, and not intentionally doped, with a thickness lying between 10 and 100 nm, preferably 50 nm; and the formation of a cap-layer 4 whose semiconductor material does not comprise aluminum, is strongly $n^{++}$ doped with a concentration higher than $10^{18} \times cm^{-3}$, and has a thickness lying between 5 and 100 nm, preferably 50 nm. The gallium-indium arsenide (GaInAs) channel layer 12 has a given forbidden bandwidth, while the Schottky layer 3 of gallium-aluminum arsenide (GaAlAs) has a greater forbidden bandwidth. The HEMT according to this arrangement is called pseudomorphic. A two-dimensional electron gas establishes itself in the HEMT at the interface 19 of the layers 12 and 3 of different forbidden bandwidths.

Figure 3B:
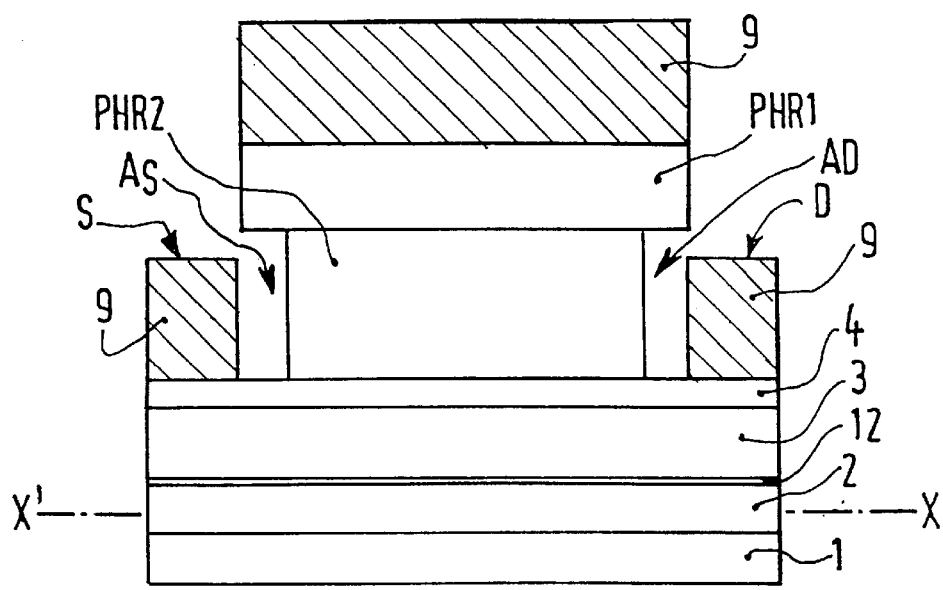

The stack of layers of semiconductor materials is completed for example by means of epitaxial growth, for which favorably a technique known to those skilled in the art is used such as molecular beam epitaxy or organo-metallic vapor phase deposition. Then, the process comprises steps of forming the electrodes of the transistor.

b) Referring to FIG. 3B, it is advantageous to first form the ohmic contacts of source S and drain D, so that the depth of etching the recess for forming the channel may be monitored very simply by controlling the drain-source current during etching. With this method, it is found that the steps of etching the recess are completed when the right current is reached, which means that the right thickness of layer 30 is obtained. This step comprises sub-steps of:

formation of two superposed photo-resist layers denoted by PHR1 and PHR2 above the stack of semiconductor layers, having different insulation and development properties, and formation of apertures AS and AD in said superposed photo-resist layers, by standard photo-lithographic technique, in such a way that the first photo-resist layer PHR1 is under-etched with respect to the second photo-resist layer PHR2. These apertures AS and AD are appropriate to define the source S and drain D electrodes. For example the first photo-resist layer PHR1 may be of the type PMMA (insulated in UV at 200 nm) and the second photo-resist layer may be of the type AZ (insulated in UV at 300 nm).

deposition of a metal layer 9 for forming ohmic contacts S and D in the apertures AS and AD on the upper surface of the subjacent semiconductor layer. The metal layer 9 deposited in other regions than these apertures $A_S$ and $A_D$ is removed for instance by a method of lift-off eliminating the two photo-resist layers PHR1 and PHR2.

Figure 3C:
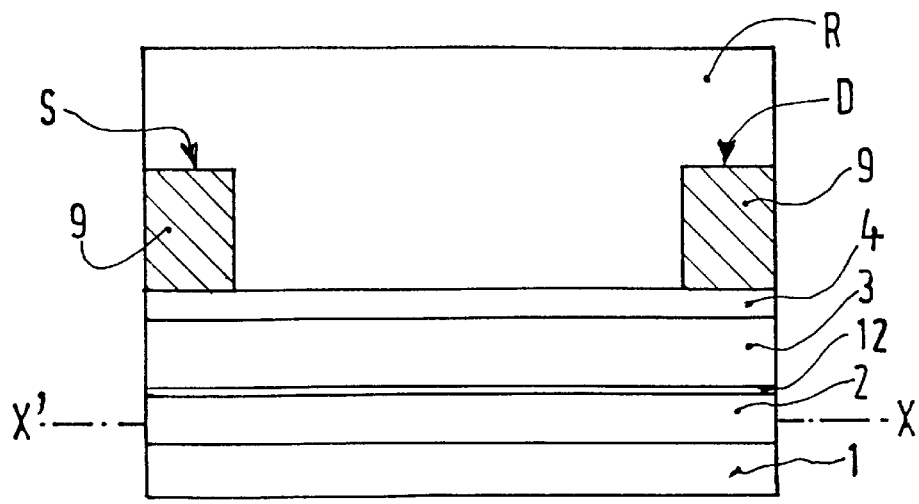
Figure 3D:
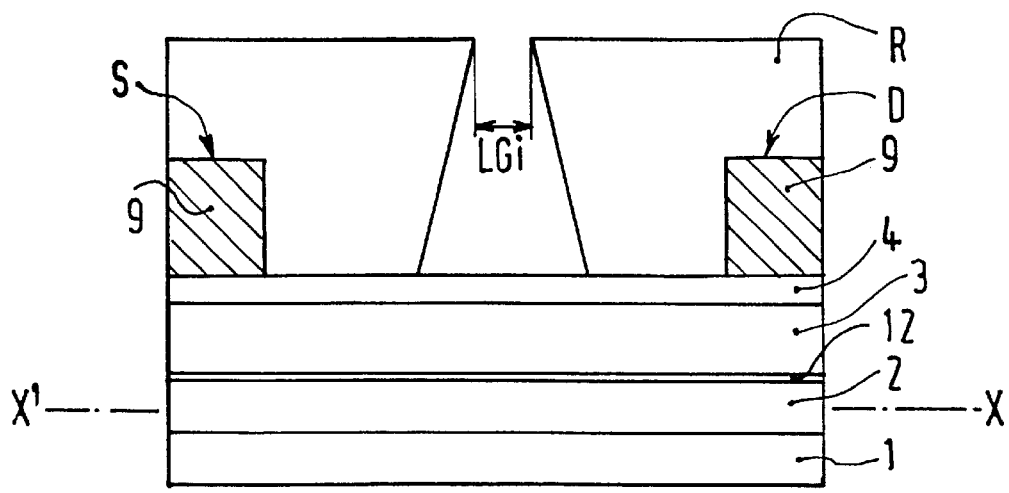
Figure 3E:
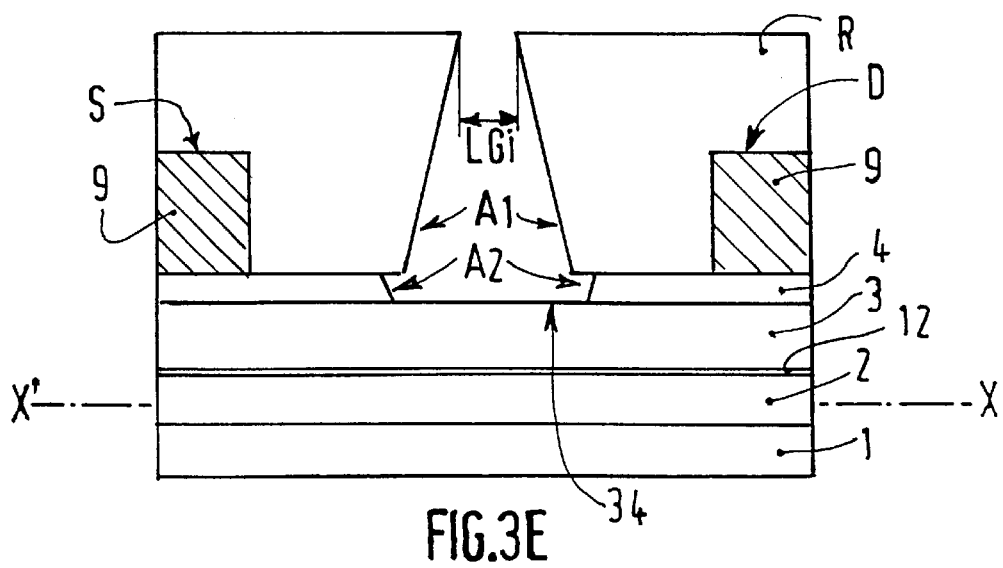

Next, the process for realizing the gate recess is carried out, comprising the subsequent steps described hereafter.

c) Referring to FIG. 3C, formation of a dielectric layer, which is preferably a photo-resist, denoted by mask layer R, covering the upper surface of the system provided by step b), and of a kind apt to be directly written using an Electron Beam lithography technique. For example, the photo-resist layer R may be of the type PMMA.

d) Referring to FIG. 3D, formation, in the photo-resist layer R, of a first opening A1, having a first width LGi. Preferably this first width LGi is 0.1 μm. This first opening A1 is preferably manufactured by Electron Beam lithography, which provides an aperture profile in the photo-resist layer that is slightly reversed, so as only the upper part of the aperture has the width LGi, the lower part being larger. The width of the upper part defines the future total width WRi of the recess. This reverse profile is useful for the further gate metal deposition and subsequent lift-off operation.

e) Referring to FIG. 3E, etching of a recess A2 in the upper part of the semiconductor stacked layers. In the present process of HEMT manufacturing, about half the height of the cap-layer 4 of gallium Arsenide GaAs is etched through the first opening A1 of the photoresist layer R in this step; this etching is performed using a wet etching technique, for instance by means of a mixture of $NH_4OH$, with $H_2O_2$ and $H_2O$. The wet etching operation is non-selective for the semiconductor material and non-directional; it etches the cap-layer material equally vertically and laterally, so it under-etches the cap-layer 4 with respect to the photo-resist layer R in a controlled manner. It is important that only a part of the cap layer is etched vertically by this non-directional etching because that permits of limiting correspondingly the lateral etching of the cap layer and as a result that permits of further limiting the final gate recess width WRi.

Figure 3F:
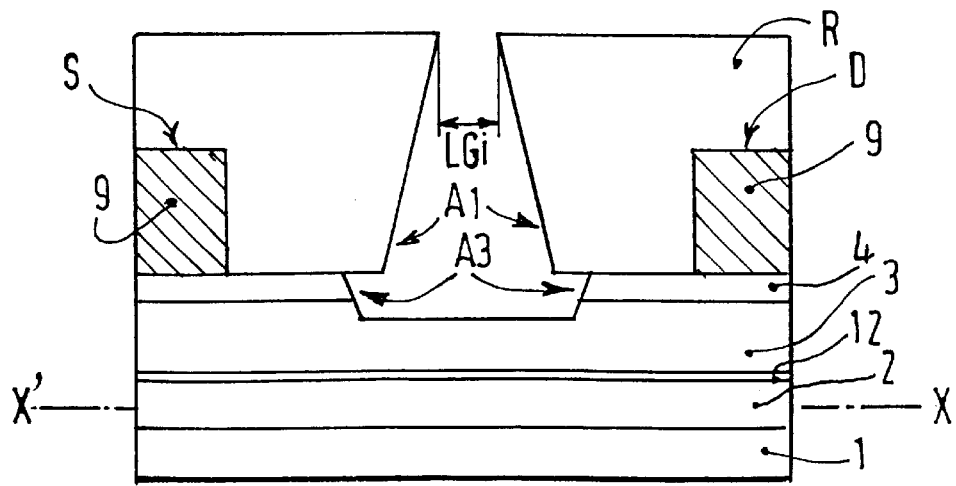
Figure 3G:
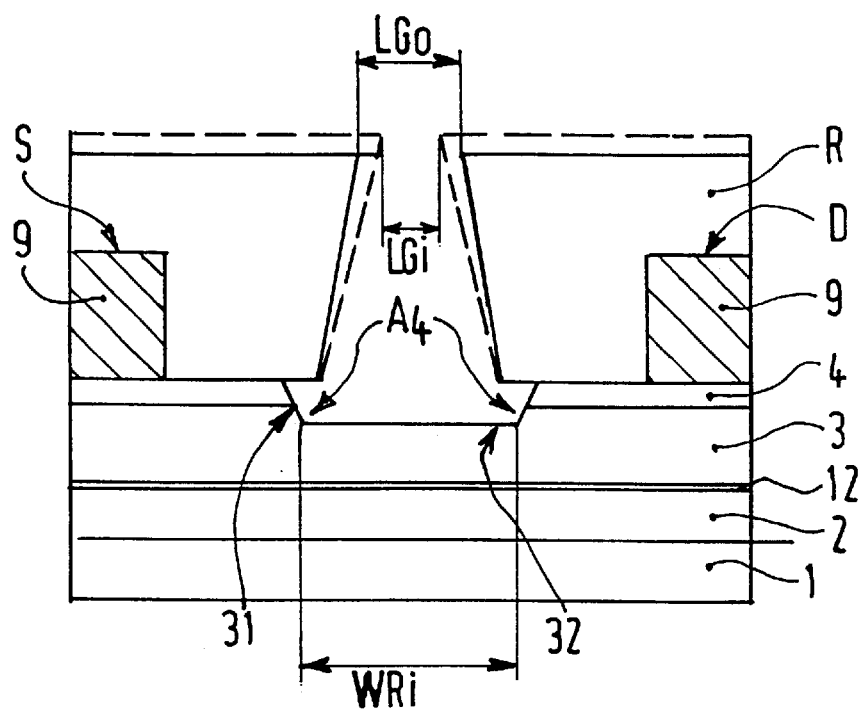

Still referring to FIG. 3E, etching further the recess denoted by A2, through the first opening A1, now using a Reactive Ion Etching (RIE) method including $SF_6$, $SiCl_4$ plasma, which is directional and selective for the semiconductor material in such a way that it etches vertically the GaAs material of the cap-layer 4 and stops automatically on the upper surface 34 of the GaAlAs material of the active layer 3; by this RIE method, an aluminum fluoride ($AlF_3$) layer is formed spontaneously to a thickness of one or two atomic monolayers at the surface 34 of the active layer 3 and constitutes a stopper layer which is further eliminated by rinsing in water; for this step it is sufficient that the aluminum concentration in the layer 3 be 0.1%; this step results in the appearance of the upper surface 34 of the subjacent active layer 3 of gallium-aluminum arsenide (GaAlAs). In this step of RIE, the lateral dimension of the recess A2 obtained by wet etching is not enlarged.

f) Referring to FIG. 3F, an etching step is carried out in the semiconductor active layer 3 so as to form a recess A3 having substantially the dimensions of the final gate recess. The opening A1 of width LGi in the photo-resist layer R still serves as a mask for realizing said recess A3. This etching preferably takes place in a non-directional wet process by means of a mixture of $NH_4OH$, with $H_2O_2$ and $H_2O$. During this etching step, the active layer 3 of GaAlAs is etched to the dimensions of the preliminary recess A2 with a slight enlargement in its lateral dimensions which is equal to the vertical etching, as known to those skilled in the art, and which leads to the recess A3; these dimensions are well controlled since this etching step starts from the exact upper level 34 of the active layer 3; this etching is stopped at a depth where the electrical characteristics which are a function of the remaining thickness 30 of the active layer 3 have been achieved, which is tested electrically on the transistor during the etching process thanks to the already present source and drain contacts. Preferably, the width WRi of the recess A3 etched in the active layer 3 is about 0.20 μm to 0.25 μm.

g) Referring to FIG. 3G, enlargement of the first opening A1 previously made in the photo-resist layer R, for forming an enlarged opening Ao, referred to as second opening Ao larger than the first opening A1 in the photo-resist R. This enlargement of A1 to Ao is performed either by using a supplementary developing operation of photolithography or by using an etching operation of the type reactive ion etching (RIE) or by using any method known of those skilled in the art, which is apt to permit of controlling this enlargement step. Preferably, this enlargement is performed using any kind of oxygen $O_2$ plasma etching, directional or non-directional. The enlarged opening Ao of width LGo performed in the resist R is suitable to delimit the deposition of the future metallization 8 for the transistor gate electrode G. Preferably the dimension LGo is 0.13 μm. The semiconductor layer are not etched in this opening enlargement step.

Figure 3H:
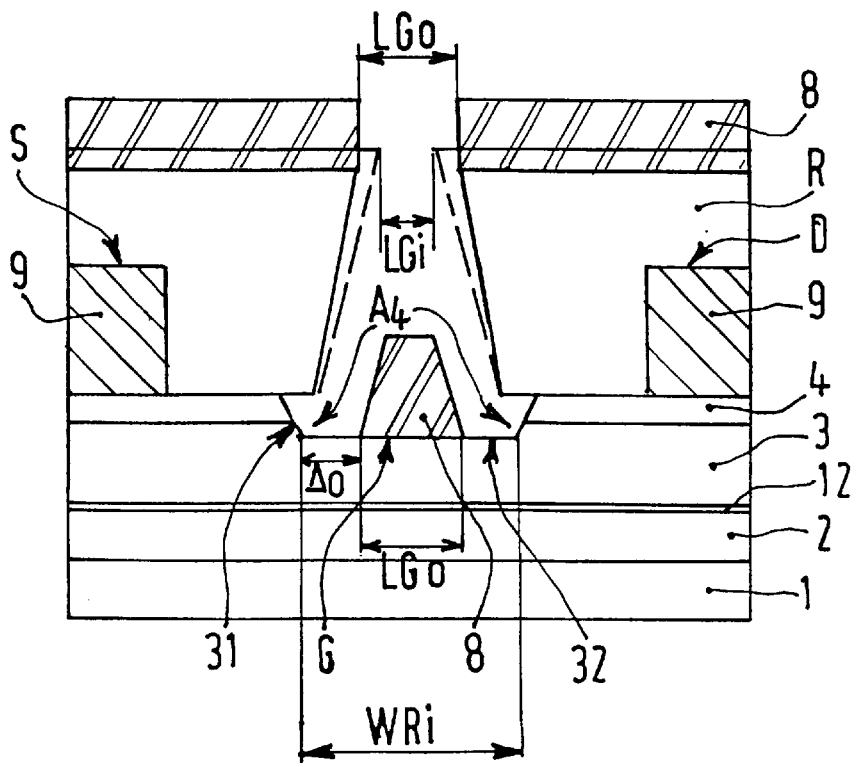

Still referring to FIG. 3G, performing a supplementary non-directional wet etching of the semiconductor layers, in accordance to the wet etching used in step f) illustrated by FIG. 2F, to adjust the threshold voltage and provide clean surfaces of the gate recess in the active layer. Those skilled in the art know how to carry out such an etching step with the required accuracy of up to a few mono-layers of semiconductor material. The etching rate is a function of the concentration of the etching agent which is known with a high accuracy; the etching depth is a function of the etching rate and the etching time. The final gate recess is denoted by A4 and has edges 31 and bottom 32.

h) Referring to FIG. 3H, deposition of a metal layer 8, carried out through the enlarged opening Ao of the photo-resist R, for realizing the gate electrode G with the accuracy of this second opening Ao, in contact with the bottom 32 of the recess A4; the metal material is deposited also over the photo-resist layer R; this resist layer R is subsequently eliminated by a known lift-off method, which also carries along the unwanted portions of the metal layer 8.

In this example, the gate length is 0.13 μm equal to LGo and, as the total recess width WRi is 0.22 μm, the access region total width is 0.09 μm. With these proposed transistor dimensions, obtained by the above-described process, the access region problem is solved and the transistor saturation current characteristics have uniform slopes.

The method according to the invention provides the advantages that the aperture enlargement step g), performed in the photo-resist R, in order to provide the enlarged aperture Ao, does not destroy the profile of the previous aperture A1, because the step of etching the photo-resist R with the oxygen plasma is not too long. As this enlargement step g) is performed near the end of the process, it avoids providing the gate recess with a too large width WRi; were this enlargement step placed at an earlier stage of the process, said gate recess width WRi would be also enlarged and the access region problem would not be solved.

What is claimed is:

1. A process of manufacturing a semiconductor device including a buried channel field effect transistor comprising, for realizing said field effect transistor, steps of forming a stacked arrangement of semiconductor layers on a substrate (1) including an active layer (3), forming a recess in said active layer, referred to as gate recess (A4), for constituting a channel between source (S) and drain (D) electrodes, and forming a submicronic gate electrode (G) which is in contact with the active layer (3) in said gate recess (A4), wherein:

the gate recess and the gate are manufactured according to predetermined respective gate recess width value (Wri) and gate length value (LGo) in order that the access region, defined between the gate (G) and the edge (31) of the gate recess (A4), has an access region width (2Δo), derived from said predetermined respective values (Wri, LGo), which is sufficiently small to permit the transistor of functioning according to saturation current characteristics that have substantially continuous slopes, wherein only one photo-resist layer is used in forming the gate recess and the gate to the respective gate recess width value (Wri) and gate length value (LGo), the access region width (2Δo) being between 0.07 μm and 0.12 μm.

2. A process as claimed in claim 1, comprising for forming the gate recess (A4) steps of:

forming a mask layer (R) upon the stacked arrangement of semiconductor layer, having a first aperture (A1) for defining a first gate length (LGi) at the gate location, forming the gate recess (A4) by etching the active layer (3), through said first aperture (A1), both laterally and vertically, to provide said gate recess (A4) having a bottom (32) at a required level in the active layer, and having edges defining the gate recess width (WRi) as a function of said first aperture (A1) of the mask layer (R), enlarging the first aperture (A1) to provide an enlarge aperture (Ao) in the mask layer (R) having the width of a value required for the gate length (LGo), depositing a metal material (8) for the gate electrode (G) through said enlarged aperture of the second width (LGo).

3. A process as claimed in claim 1, wherein the semiconductor layers are compounds of III–V materials, including:

a substrate of gallium arsenide (1);

an active layer (3) having a non-zero concentration of aluminum (A1) formulated by gallium-aluminum arsenide;

a cap layer (4) having a zero concentration of aluminum formulated by gallium arsenide.

4. A process as claimed in claim 3, wherein the etching of the cap-layer and active layer through the first opening (A1) is essentially performed by a technique that etches the semiconductor material both vertically and laterally, to provide said gate recess (A4) having a bottom (32) at a required level in the active layer (3) and having edges (31) defining the gate recess width (WRi) as a function of said first opening width (A1).

5. A process as claimed in claim 3, wherein the etching of the cap layer comprises a first stage of non-directional etching to provide under etching of said cap-layer with respect to the dielectric layer, and a second stage of directional etching with a compound of fluoride for forming a stopper layer of aluminum fluoride as soon as the etching reaches the upper surface of the active layer (3).

6. A process as claimed in claim 5, wherein a step of non-directional etching is performed between the step of forming the enlarged opening mask layer (R) and the step of depositing the gate metal material (8), for cleaning the surfaces of the gate recess and adjusting the bottom level (32).

7. A process as claimed in claim 6, wherein the non-directional etching for the cap layer and the active layer is a wet etching, and the directive etching for the cap-layer is performed using a plasma of fluorine compound.

8. A process as claimed claim 5, wherein the mask layer is of a photo resist material in which the first aperture (A1) is performed by Electron Beam lithography, and ($O_2$) plasma technique to provide the enlarge opening (Ao) of the required width for the actual gate (LGo).

9. A process as claimed in claim 1, wherein the source and drain electrodes (S, D) are performed before the mask layer (R) is deposited.

10. A process as claimed in claim 1, wherein a channel layer (12), having a forbidden bandwidth inferior to that of the active layer (3), is formed below the active layer (3).

11. The process of claim 1, wherein LGo is 0.07 $\mu$m–0.2 $\mu$m.

12. The process of claim 7, wherein only a part of the cap layer is etched vertically by the non-directional etching.

* * * * *